July 21, 1964 H. G. SILKMAN 3,141,998

COOLED MODULAR ELECTRONIC PACKAGE

Filed Feb. 24, 1960 2 Sheets-Sheet 1

INVENTOR

Harry G. Silkman

BY Q. Baxter Warner
Claude Funkhouser
ATTORNEYS

July 21, 1964 H. G. SILKMAN 3,141,998

COOLED MODULAR ELECTRONIC PACKAGE

Filed Feb. 24, 1960 2 Sheets-Sheet 2

INVENTOR

Harry G. Silkman

BY Q. Baxter Warner
Claude Funkhouser
ATTORNEYS

United States Patent Office 3,141,998
Patented July 21, 1964

3,141,998
COOLED MODULAR ELECTRONIC PACKAGE
Harry G. Silkman, Akron, Ohio, assignor, by mesne assignments, to the United States of America as represented by the Secretary of the Navy
Filed Feb. 24, 1960, Ser. No. 10,822
7 Claims. (Cl. 317—100)

This invention relates generally to improvements in electronic packaging and the like and more particularly to new and improved modular electronic packages for printed circuits, such new and improved packages providing increased cooling efficiency and greater resistance to vibration.

In the field of miniaturized electronic packaging, it has been the general practice to utilize printed circuits in the form of small modules which are stacked up in "club sandwich" fashion and bolted together to form a single light replaceable unit. Although such devices have served the purpose, they have not proved entirely satisfactory under all conditions of service in that considerable difficulty has been experienced in the form of frequent failure of electronic components incorporated into said modules due to the subjection of such electronic packages to great extremes of temperature and excessive vibration, such conditions being very commonly encountered in long range guided missiles. Those concerned with the development of such miniaturized electronic packages have long recognized the need for increased cooling efficiency of such devices together with improved rigidity for greater resistance to vibration. The present invention provides substantially all of the desirable features of printed circuit electronic modules, heretofore or now in general use, while obviating substantially all of the shortcomings thereof by providing a high degree of cooling efficiency and improved rigidity in such electronic packages, thus fulfilling the critical need for a device of such characteristics, especially in the area of missile guidance so essential to the national defense.

The general purpose of this invention is thus to provide a printed circuit modular electronic package which embraces all the advantages of similarly employed printed circuit packages and possesses none of the aforedescribed disadvantages. To attain this, the present invention contemplates a unique laminated structure comprising a cold plate of any heat conductive material, a conventional printed circuit board, and a layer of dampening material. Electronic components are directly mounted on the cold plate and electrically connected to the printed circuit board through clearance holes provided in the cold plate, the cold plate being further provided with coolant passages, for the flow of coolant therethrough, to maintain the temperature of the surface of the cold plate and of the electronic components secured thereto within tolerable limits. The layer of dampening material serves the dual function of providing electrical insulation for the printed circuit board and simultaneously providing mechanical dampening for any and all vibration to which the entire electronic package may be subjected. The specific structure of the inventive device, hereinafter described in detail, provides excellent thermal coupling between electronic components and the cooling medium while preventing such electronic components from coming into actual direct contact with any of the coolant. The instant device is further characterized by a high degree of rigidity and resistance to the effects of vibrational service and in which the various cooling circuits are arranged for ready inspection in the field for possible leakage without necessitating disassembly of any portion of the electronic package.

An object of the present invention is the provision of an improved miniaturized modular electronic package.

Another object is to provide an improved miniaturized modular electronic package utilizing printed circuits.

A further object of this invention is the provision of a modular electronic package having increased cooling efficiency.

Still another object is to provide a modular electronic package having increased cooling efficiency and greater resistance to vibration.

Still a further object of the present invention is the provision of a modular electronic package having increased cooling efficiency yet which does not allow the coolant to come into direct contact with any of the electrical components.

Yet another object is the provision of a modular electronic package having increased cooling efficiency and enabling the cooling circuits to be readily inspected in the field for leakage without requiring disassembly of any portion of the electronic package.

A still further object of the present invention is the provision of an improved modular electronic package having increased cooling efficiency and resistance to vibration yet which is sufficiently small to facilitate ready replacement.

An additional object is to provide an improved modular electronic package having increased cooling efficiency and resistance to vibration, and which may be stacked in "sandwich" fashion and bolted together to form a single larger electronic package having readily replaceable individual modules.

Other objects and many of the attendant advantages of this invention will be readily appreciated as the same becomes better understood by reference to the following detailed description when considered in connection with the accompanying drawings wherein.

Figure 3:
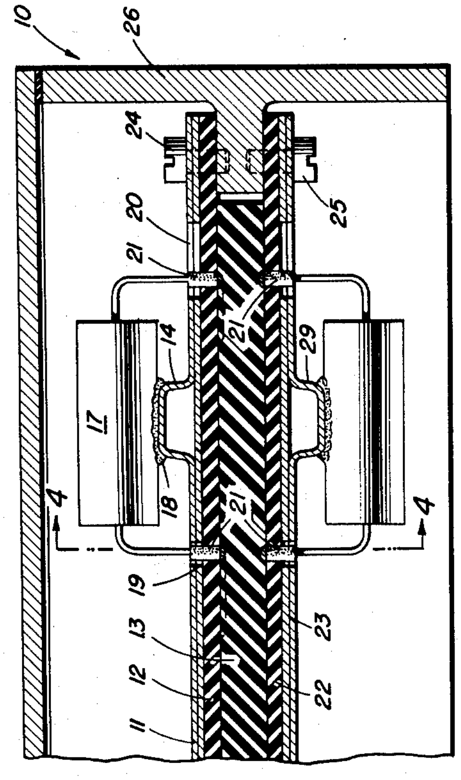
FIG. 3 is a sectional view taken substantially on the line 3—3 of FIG. 1.
Figure 4:
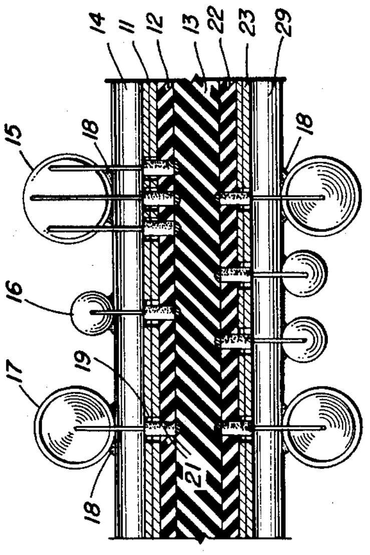
FIG. 4 is a sectional view taken substantially on the line 4—4 of FIG. 3.

Referring now to the drawings, wherein like reference characters designate like or corresponding parts throughout the several views, there is shown in FIGS. 3 and 4, which illustrate one embodiment of the invention, a cooled modular electronic package 10 embodying the structural features of the instant invention. The modular electronic package 10 includes a substantially flat cold plate 11, constructed of any suitable heat-conductive material, affixed to one side of a conventional copper clad laminated printed circuit board 12, which may be an epoxy fibreglass printed circuit board or the like for added vibrational resistance, and a lamina of dampening material 13 on the other side of the printed circuit board 12 from that affixed to the cold plate, and in contacting relation thereto. The cold plate 11 is provided with coolant passages or conduits 14, either molded or stamped directly into the cold plate 11 or which may consist of conduits which are either brazed, soldered, welded, etc., or formed and affixed in any other convenient manner to the surface of the cold plate 11 to effect the rapid removal of heat therefrom. A plurality of electronic components 15, 16 and 17, for example, are mounted on the cold plate 11, and if desired, may be physically secured to the surface of the cold plate 11 by suitable means such as stamping or by means of a heat-conductive cement 18 or the like, shown in FIG. 3. The components 15, 16 and 17 are electrically connected to portions of the printed circuit board 12 through clearance holes such as 19 and 20 provided in the cold plate 11. The clearance holes 19 and 20 in cold plate 11 may be insulated if necessary by means of sleeves of insulation material 21 or by means of the inclusion of an additional layer of electrical insulation (not shown), situated between the cold plate 11 and the printed circuit board 12 and coextensive with these layers. The layer 13 of dampening material, which may be of resilient silicone rubber or the like, serves the dual function of providing both electrical insulation for the printed circuit board 12 and simultaneously providing adequate mechanical dampening for any vibrations to which the entire electronic modular package 10 may be subjected. The other side of the lamina 13 of dampening material may be placed in contact with a second printed circuit board 22 which is in turn fixed to a second cold plate 23 similar in structure to the cold plate 11 previously described. Thus the electronic modular package 10 comprises a symmetrical laminated structure, the various layers of which are secured together by means of feed-through connectors such as 24 and 25 shown in FIG. 3 of the drawings, to produce a compact integral unit. Hence, the electronic deck or modular package 10 is in essence a two-sided "sandwich" with the electrical components and cold plates on the outside and electrical insulation and printed circuit boards on the inside.

Figures 1, 2:
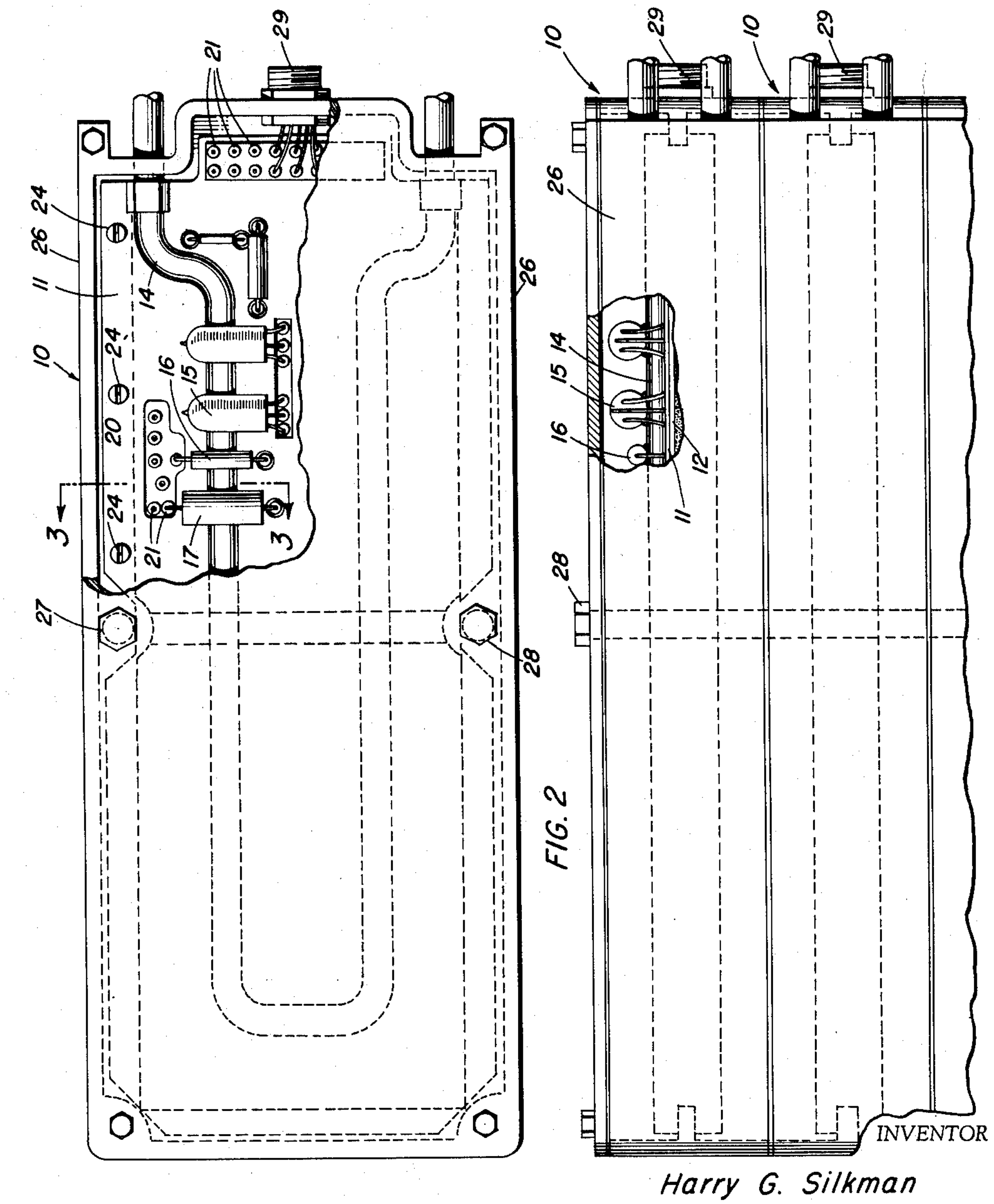
FIG. 1 is a top plan view of a cooled modular electronic package with a portion of the top cover removed to illustrate interior parts.
FIG. 2 is a side elevational view illustrating a series of modules in stacked relationship with a portion of one module being broken away to show elements located therein.
Figure 5:
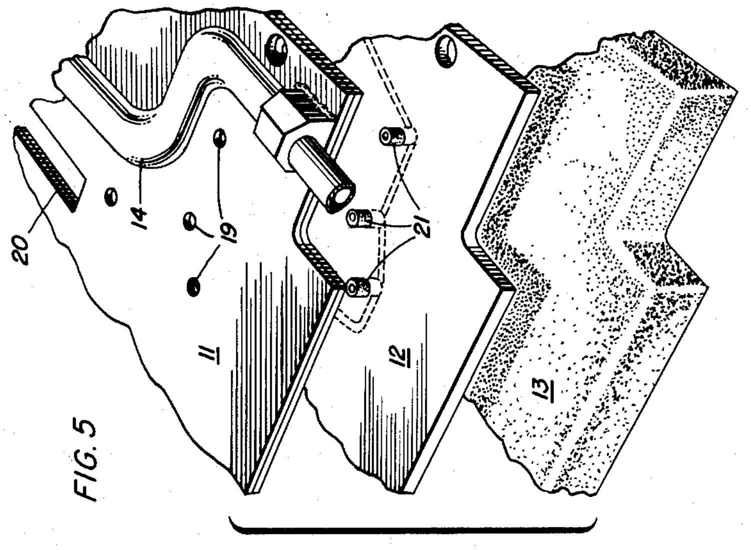
FIG. 5 is an exploded perspective view of a module showing the cold plate, printed circuit board and dampening material layers.

This laminated structure is mounted in picture-frame fashion in an outer frame casing 26 for support, which casing may be a light aluminum or magnesium casting or the like. The latter frame casing 26 provides mechanical support for the laminated structure and simultaneously functions as a portion of the outer casing of a larger integral electronic package formed from a plurality of the smaller cooled electronic module packages. For this purpose, holes are provided in each casing so that the modules 10 may be stacked one above the other and bolted together by means of bolts 27 and 28 shown in FIGS. 1 and 2, to form a larger electronic package of a convenient size which may be handled by one man, and in which, in the event of some circuit malfunction, any of the individual modules in such a stack may be readily replaced. Such a stacking arrangement is illustrated in FIG. 2 of the drawings. Coolant connections, for water or the like, are carried on the outside of the frame casing 26 so as to allow for ready inspection in the field for possible coolant leakage without necessitating any disassembly of the stack of modules. Coolant connections between modules in a given package are made by means of an external manifold block (not shown). Coolant flow control orifices and the connections to the coolant supply and discharge manifolds may be made with tubing and conventional aircraft-type tubing fittings. Electrical connections between modules are made by means of multi-conductor cables connected to adapter plugs such as 29, shown in FIG. 1, mounted on the outside of casing 26.

In the operation of the device, heat is passed from the electrical components, primarily by direct conduction, to the cold plates 11 and 23, and thence to the fluid coolant flowing through the passages 14 and 29 in the cold plates 11 and 23, respectively, whence the heat is effectively removed. Although only a single coolant conduit is shown for each cold plate layer, it is understood that more than one such coolant conduit for each cold plate layer may be readily provided. The single layer of dampening material 13 simultaneously fulfills its intended functions for the pair of printed circuit boards 12 and 22. The resulting device is extremely rugged, resistant to vibration, and capable of withstanding extremely high temperatures for a considerable duration of time. The latter conditions are typical of those encountered in long range guided missiles, and it is primarily with this application in mind, that the instant invention was developed. However, it should be obvious that such a cooled electronic package may be utilized wherever such difficult thermal and vibrational conditions are to be met.

Obviously many modifications and variations of the present invention are possible in the light of the above teachings. It is therefore to be understood, that within the scope of the appended claims, the invention may be practiced otherwise than as specifically described. Having thus described the invention, what is claimed is:

1. A cooled modular electronic device for printed circuits comprising a pair of substantially flat heat conductive cold plate layers, a pair of copper clad epoxy fibreglass printed circuit board layers coextensive with and secured between said cold plate layers, a resilient electrically insulating layer of silicone rubber coextensive with and separating said pair of printed circuit board layers, an outer supporting frame of a light metal to which said layers are secured to form a single laminated structure supported at its outer periphery within said supporting frame, a plurality of clearance holes extending through said cold plate layer to said printed circuit board layers, a plurality of electrical components physically secured to said cold plate layers by a heat-conductive cement and electrically connected to said printed circuit board layers through said clearance holes, means disposed with relation to said holes for electrically insulating said electrical components from said cold plate layers, and at least one coolant conduit for each of said cold plate layers positioned in heat-conductive relation thereto, the inlet and outlet connection fittings of said coolant conduit being mounted on the outside of said supporting frame for easy access and inspection.

2. A cooled modular electronic package for printed circuits comprising a pair of substantially flat heat conductive cold plate layers, a pair of laminated printed circuit board layers coextensive with and secured between said cold plate layers, a resilient layer of electrical insulation coextensive with and separating said pair of printed circuit board layers to form a laminated structure, an outer frame of a light material for supporting said laminated material structure, a plurality of clearance holes extending through said pair of cold plate layers to the printed circuit board layers, a plurality of electrical components physically secured in heat-conductive relation to said cold plate layers and electrically connected to said printed circuit boards through said clearance holes, means inserted in said holes for electrically insulating said electrical components from said cold plate layers, and at least one coolant conduit in heat-conductive relation to each of said cold plates, the inlet and outlet connections of said coolant conduit being mounted on the outside of said frame for easy access and inspection.

3. A cooled modular electronic package for printed circuits comprising a pair of heat conductive cold plate layers, a pair of printed circuit board layers coextensive with and secured between said cold plate layers, a layer of electrically insulating resilient dampening material coextensive with and separating said pair of printed circuit board layers to form a laminated structure, a plurality of clearance holes extending through said cold plate layers to said printed circuit boards, a plurality of electrical components physically secured to said cold plate layers and electrically connected to said printed circuit boards through said clearance holes, and means to effect the rapid removal of heat from said cold plate layers.

4. A cooled modular electronic package for printed circuits comprising a pair of substantially flat heat conductive cold plate layers, a pair of printed circuit board layers coextensive with and disposed between said cold plate layers, a resilient electrically insulating layer of dampening material coextensive with and separating said pair of printed circuit board layers, an outer supporting frame of a light material in which all of said layers are secured together to form a single laminated structure supported at its outer periphery within said supporting frame, a plurality of clearance holes extending through said cold plate layers to said printed circuit boards, a plurality of electrical components physically secured to said cold plate layers by a heat conductive cement and electrically connected to said printed circuit boards through said clearance holes, at least one coolant conduit for each of said cold plates and in heat conductive relation thereto, the inlet and outlet connection fittings for said coolant conduits being mounted on the outside of said supporting frame for easy access and inspection.

5. A cooled modular electronic package for printed circuits comprising a heat conductive cold plate layer, a layer consisting of a printed circuit board coextensive and in contact with said cold plate layer, a resilient electrically insulating layer of dampening material coextensive with and secured to said printed circuit board layer, a plurality of clearance holes extending through said cold plate layer to the printed circuit board, a plurality of electrical components physically secured to said cold plate layer in heat conductive relation thereto and electrically connected to said printed circuit board through said clearance holes, and cooling means for the effective rapid removal of heat from said cold plate layer.

6. The modular electronic package of claim 5 wherein said cooling means comprises at least one coolant conduit positioned in heat conductive relation to said cold plate layer.

7. A cooled modular electronic package for printed circuits comprising a heat conductive layer, a printed circuit board layer coextensive and in contact with said heat conductive layer, a plurality of clearance holes extending through said heat conductive layer to said printed circuit board layer, a plurality of electrical components physically secured to said heat conductive layer in heat conductive relation thereto and electrically connected to said printed circuit board layer through said clearance holes, and at least one cooling conduit in heat conducting contact with said heat conductive layer for removing heat from said heat conductive layer.

References Cited in the file of this patent

UNITED STATES PATENTS

| | | |
|---|---|---|
| 2,692,961 | Fondiller | Oct. 26, 1954 |
| 2,766,409 | Parrish | Oct. 9, 1956 |
| 2,796,559 | Feucht | June 18, 1957 |
| 2,881,364 | Demer | Apr. 7, 1959 |
| 2,885,603 | Rose | May 5, 1959 |
| 2,912,624 | Wagner | Nov. 10, 1959 |